(12) United States Patent
Tzivanopoulos et al.

(10) Patent No.: US 10,981,451 B2
(45) Date of Patent: Apr. 20, 2021

(54) ELECTRICAL ENERGY STORAGE SYSTEM COMPRISING A CROSS-CONNECTION OF A PLURALITY OF PARALLEL ENERGY STORAGE STRINGS THAT IS ELECTRICALLY CONDUCTIVELY CONNECTED TO A CURRENT DETECTION MEANS VIA A DIODE, AND METHOD FOR DETECTING A CONDUCTION FAULT

(71) Applicant: Robert Bosch GmbH, Stuttgart (DE)

(72) Inventors: Chrysanthos Tzivanopoulos, Remseck Am Neckar (DE); Sven Bergmann, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/336,925

(22) PCT Filed: Sep. 26, 2017

(86) PCT No.: PCT/EP2017/074328
§ 371 (c)(1),
(2) Date: Mar. 27, 2019

(87) PCT Pub. No.: WO2018/060179
PCT Pub. Date: Apr. 5, 2018

(65) Prior Publication Data
US 2020/0033392 A1    Jan. 30, 2020

(30) Foreign Application Priority Data

Sep. 27, 2016  (DE) .................... 10 2016 218 516.0

(51) Int. Cl.
*B60L 3/00*    (2019.01)
*G01R 31/396*  (2019.01)
(Continued)

(52) U.S. Cl.
CPC ............. *B60L 3/0046* (2013.01); *B60L 58/18* (2019.02); *G01R 31/005* (2013.01);
(Continued)

(58) Field of Classification Search
CPC .. H05B 1/00; H05B 31/00; H02J 1/00; H01M 2/00; H01M 2200/00; B25F 1/00;
(Continued)

(56) References Cited

U.S. PATENT DOCUMENTS

| | | | | |
|---|---|---|---|---|
| 5,936,383 A | * | 8/1999 | Ng .................... | G01R 31/396 320/132 |
| 2011/0080139 A1 | * | 4/2011 | Troxel .............. | H01M 10/4207 320/134 |

(Continued)

FOREIGN PATENT DOCUMENTS

| | | |
|---|---|---|
| CN | 102884438 A | 1/2013 |
| DE | 102011011798 A1 | 8/2012 |

(Continued)

OTHER PUBLICATIONS

International Search Report for Application No. PCT/EP2017/074328 dated Dec. 7, 2017 (English Translation, 2 pages).

*Primary Examiner* — Jermele M Hollington
*Assistant Examiner* — Temilade S Rhodes-Vivour
(74) *Attorney, Agent, or Firm* — Michael Best & Friedrich LLP

(57) ABSTRACT

Electrical energy storage system (1), comprising at least two strings (STR1, STR2, STR3) interconnected in parallel connection, wherein the strings each have at least two electrical energy storage units (15) interconnected in series connection, characterized in that at least one first electrically conductive cross-connection (11) between electrical energy storage units (15) at an identical first electrical potential in the strings (STR1, STR2, STR3) interconnected in parallel (Continued)

connection is electrically conductively connected via at least one diode (12) to a means for detecting an electric current (13) and a controllable electrical energy source (14), wherein the diode (12) is not incorporated into the first electrically conductive cross-connection (11).

13 Claims, 5 Drawing Sheets

(51) Int. Cl.
*G01R 31/382* (2019.01)
*B60L 58/18* (2019.01)
*G01R 31/50* (2020.01)
*G01R 31/00* (2006.01)
*H01M 10/48* (2006.01)

(52) U.S. Cl.
CPC ......... *G01R 31/382* (2019.01); *G01R 31/396* (2019.01); *G01R 31/50* (2020.01); *H01M 10/482* (2013.01); *H01M 2220/20* (2013.01)

(58) Field of Classification Search
CPC ........ H02M 1/00; H02P 1/00; H02P 2101/00; H02P 2201/00
See application file for complete search history.

(56) References Cited

U.S. PATENT DOCUMENTS

| | | | |
|---|---|---|---|
| 2012/0175961 A1* | 7/2012 | Har-Shai | H02J 1/00 307/80 |
| 2012/0274138 A1* | 11/2012 | Bundschuh | G05F 1/67 307/64 |
| 2012/0281444 A1* | 11/2012 | Dent | H02M 1/32 363/56.01 |
| 2014/0203654 A1 | 7/2014 | Takahashi et al. | |
| 2015/0137606 A1* | 5/2015 | Adest | H02J 3/385 307/77 |

FOREIGN PATENT DOCUMENTS

| | | |
|---|---|---|
| DE | 102011115452 | 4/2013 |
| DE | 102011115550 | 4/2013 |
| EP | 2994341 | 3/2016 |
| FR | 3013902 | 5/2015 |
| JP | 2004031268 | 1/2004 |
| WO | 2013050089 A1 | 4/2013 |
| WO | 2015079129 A1 | 6/2015 |

* cited by examiner

ELECTRICAL ENERGY STORAGE SYSTEM COMPRISING A CROSS-CONNECTION OF A PLURALITY OF PARALLEL ENERGY STORAGE STRINGS THAT IS ELECTRICALLY CONDUCTIVELY CONNECTED TO A CURRENT DETECTION MEANS VIA A DIODE, AND METHOD FOR DETECTING A CONDUCTION FAULT

BACKGROUND OF THE INVENTION

The present invention relates to an electrical energy storage system, a method for detecting a line fault, a device, and a use of the electrical energy storage system.

Nowadays, particularly in the automobile construction industry, electrical energy storage systems are typically configured by means of a series connection of a plurality of individual electrical energy storage units. If necessary, a parallel connection of multiple individual cells is carried out in order, for example, to increase the range or power.

Due to the requirements for the safety of an electrical energy storage system, the individual electrical energy storage units in a series connection are monitored individually with respect to physical variables, for example, current and voltage. If a parallel connection of a plurality of strings, i.e., a parallel connection of a plurality of series connections of a plurality of individual electrical energy storage units, is now carried out, it is possible to ensure monitoring of the individual cells which is reliable and which meets the safety requirements.

In the publication DE 10 2011 115 550 A1, a lithium-ion battery is described which comprises a plurality of cells arranged in parallel strings, including an overvoltage protection device, wherein the overvoltage protection device comprises a plurality of electronic switches which are installed in cross-connections running transversely to the parallel strings.

In the publication FR 3 013 902, a device is described comprising a battery, wherein power switches are installed in cross-connections of battery cells.

SUMMARY OF THE INVENTION

An electrical energy storage system is provided, comprising at least two strings interconnected in parallel; wherein the strings respectively comprise at least two electrical energy storage units interconnected in series, a method for detecting a line fault, a device, and a use of the electrical energy storage system.

In the electrical energy storage system, at least a first electrically conductive cross-connection, between electrical energy storage units in the strings which are interconnected in parallel and which are at an identical first electrical potential, is electrically conductively connected, via at least one diode, to a means for detecting an electric current and a controllable electrical energy source, wherein the diode is not installed in the first electrically conductive cross-connection. As a result, the first electrically conductive cross-connection can be monitored for various faults, for example, a break in the first electrically conductive cross-connection. This is advantageous, since the requirements for safety are met via the first electrically conductive cross-connection, even without monitoring of the individual cells of the energy storage units which are electrically conductively connected via the first cross-connection; thus, correct functioning of the first electrically conductive cross-connection is highly relevant to the safety of the electrical energy storage system.

Advantageously, the at least one first electrically conductive cross-connection is electrically connectively connected, via the at least one diode, to at least a second electrically conductive cross-connection between electrical energy storage units in the strings which are interconnected in parallel and which are at an identical second electrical potential, wherein the first electrical potential and the second electrical potential are different. By means of the electrical connection via the diode, the two cross-connections may be monitored in a simple manner for a possible line fault. If necessary, this can be continued in the same manner for additional electrically conductive cross-connections.

Advantageously, the at least one second electrically conductive cross-connection, referenced to a defined reference potential, is at a higher electrical potential than the at least one first electrically conductive cross-connection. In this case, the at least one diode is installed in the forward direction between the at least one first electrically conductive cross-connection and the at least one second electrically conductive cross-connection. Thus, a current flow is possible from the first electrically conductive cross-connection to the second electrically conductive cross-connection, without the occurrence of a short circuit and a subsequent undesirable discharge of the electrical energy storage units.

Advantageously, the diode and the electrically conductive connection including the means for detecting a current are situated at different ends of the second electrically conductive cross-connection. Thus, it is in particular ensured that both the first and the second cross-connection can be monitored, since the electrical path to the means for detecting a current always includes both electrically conductive cross-connections.

Advantageously, the controllable electrical energy source is a current source. Thus, the electrically conductive cross-connections are monitored, for example, for a line fault, in particular for a line break, by generating a low current, for example, in the range of 0 mA to 20 mA, preferably in the range from 0 mA to 10 mA. By using a current source, the undesirable effect of electromagnetic radiation is reduced.

Advantageously, the electrical energy storage unit may be understood to be in particular an electrochemical battery cell and/or a battery module comprising at least one electrochemical battery cell and/or a battery pack comprising at least one battery module. For example, the electrical energy storage unit may be a lithium-based battery cell or a lithium-based battery module or a lithium-based battery pack. In particular, the electrical energy storage unit may be a lithium-ion battery cell or a lithium-ion battery module or a lithium-ion battery pack. Furthermore, the battery cell may be of the type: lithium-polymer battery, nickel-metal hydride battery, lead-acid battery, lithium-air battery, or lithium-sulfur battery, or generally a battery having any arbitrary electrochemical composition.

Furthermore, the subject matter of the disclosure is a method for detecting a line fault in an electrical energy storage system according to the present invention, wherein at least a first current signal profile is detected via a means for detecting a current, the detected at least one first current signal profile is compared to a second current signal profile specified by a controllable electrical energy source, and a signal is generated indicating the detection of a line fault in the electrical energy storage system, if a predefined signal deviation threshold value is exceeded. By evaluating the current signal profiles, in addition to simple line break detection, further diagnosis options are made possible. For example, potential faults can be detected even before their actual occurrence, by comparison with suitable signal deviation threshold values. The signal deviation threshold values may, for example, be calculated from a shifting of extreme points, for example, high, low, or inflection points, in the first current signal profile, or also by means of the difference between the first current signal profile and the second current signal profile which is specified by the energy source, integrated over one or a plurality of periods. Here, it is not necessary that the second current signal profile is detected via a means for detecting a current, since said profile is assumed to be known and may therefore be used in a simple manner, for example, "internally" in a computation unit.

Advantageously, the controllable energy source is activated in the method in such a way that it generates a pulse-shaped second current signal profile. As a result, in particular changes in the current signal profile are clearly apparent.

Advantageously, the method is carried out for at least one predefined period. The predefined period may be an integer multiple of a period duration of the current signal. Thus, changes in the position of extreme points in the current signal profile may be easily identified, and it is not necessary to carry out the method continuously, i.e., in an infinite loop. Thus, the method may be carried out with relatively minimal requirements for computing time and memory.

Furthermore, the subject matter of the disclosure is a device which comprises an electrical energy storage system according to the present invention and an electronic control unit, which is configured to carry out all steps of the method according to the present invention. Thus, both the advantages of the method according to the present invention and its implementation in an electronic control unit, as well as the advantages of the electrical energy storage system according to the present invention, may be achieved. The combination achieves the system advantage that the method can be applied to the current signal profile detected by the means for detecting a current, and a line fault can thereby be detected in the electrical energy storage system according to the present invention.

Furthermore, the subject matter of the disclosure is a use of the electrical energy storage system according to the present invention in electrically driven vehicles and stationary electrical energy storage units, as well as electrically operated hand tools. The electrical energy storage system according to the present invention may thus be used in a flexible manner, and is not designated for a particular application area. Thus, the aforementioned advantages may be conferred to the specified application areas.

BRIEF DESCRIPTION OF THE DRAWINGS

Advantageous embodiments of the present invention will be depicted in the figures and will be described in greater detail in the following description The following are shown.

DETAILED DESCRIPTION

Figure 1:
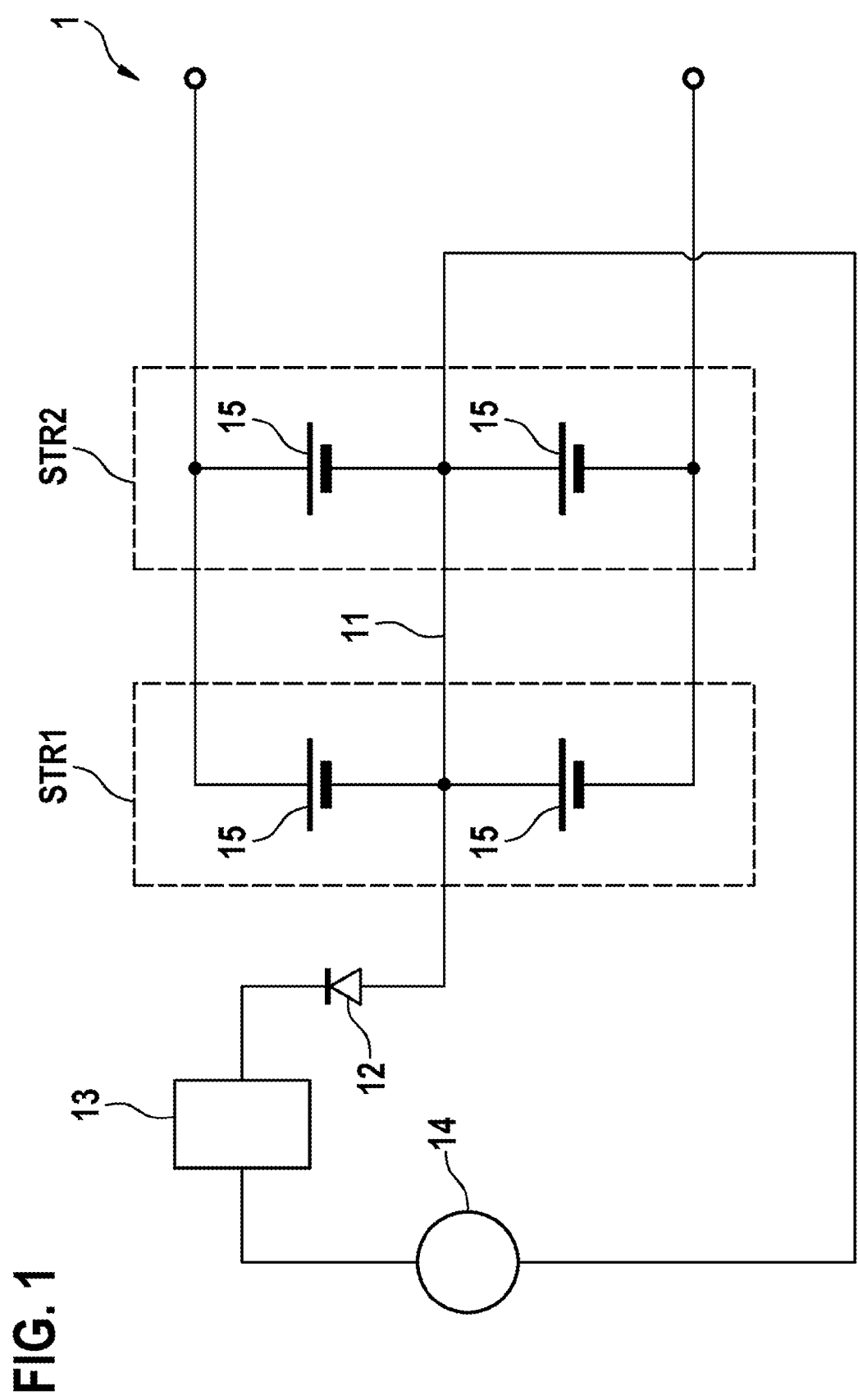
FIG. 1 shows a schematic representation of the electrical energy storage system according to the present invention, according to a first embodiment.

In all figures, identical reference numerals refer to identical device components or identical method steps.

FIG. 1 shows a schematic representation of the electrical energy storage system 1 according to the present invention, according to a first embodiment. The electrical energy storage system 1 comprises two strings STR1, STR2 interconnected in parallel, wherein the strings STR1, STR2 respectively comprise two electrical energy storage units 15 interconnected in series. A first electrically conductive cross-connection 11, between electrical energy storage units 15 in the strings STR1, STR2 which are interconnected in parallel and which are at an identical first electrical potential, is electrically conductively connected, via a diode 12, to a current sensor 13, for example, a Hall sensor or a shunt-based current sensor, and to an electrical energy source 14.

Figure 2:
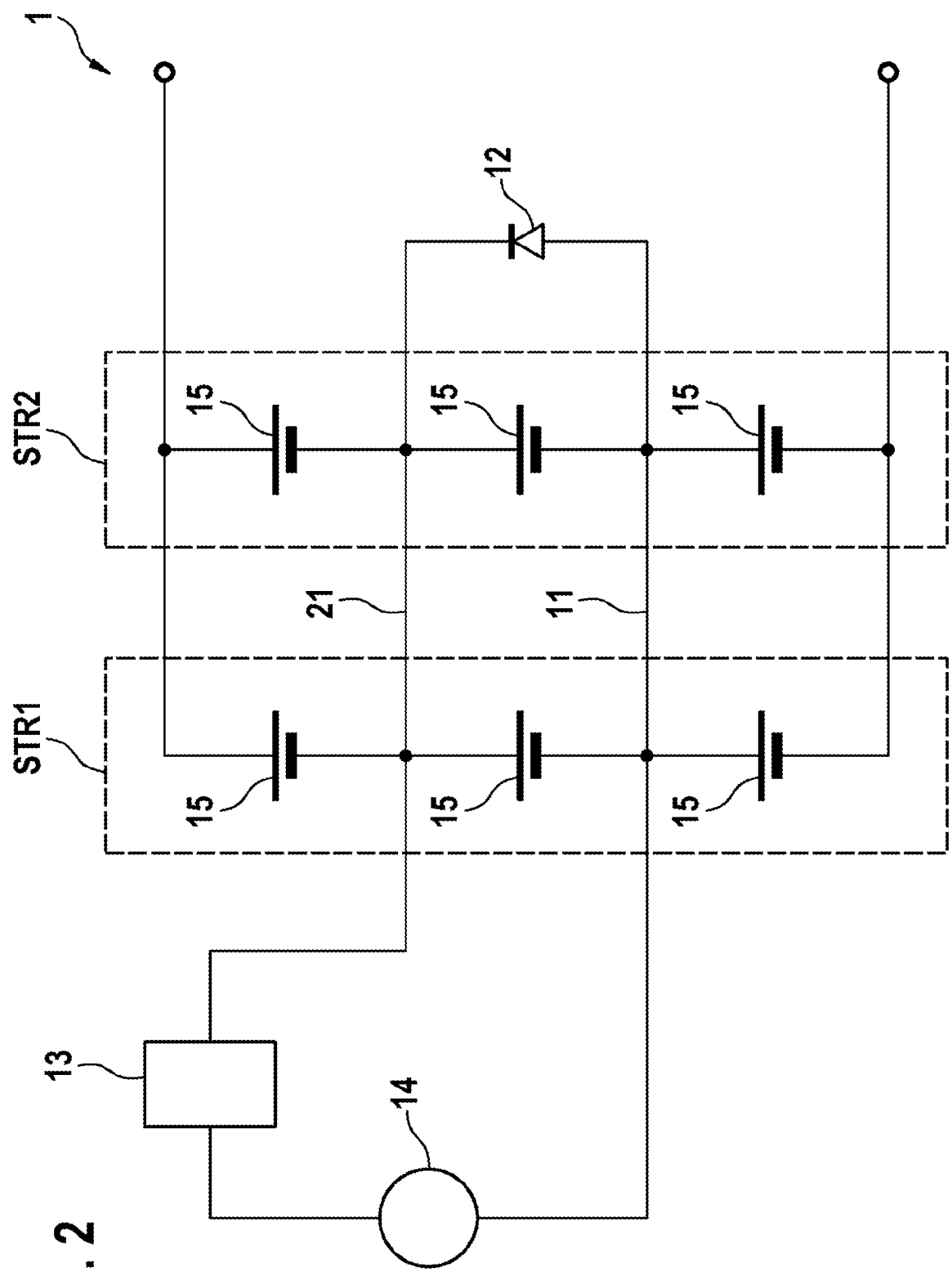
FIG. 2 shows a schematic representation of the electrical energy storage system according to the present invention, according to a second embodiment.

FIG. 2 shows a schematic representation of the electrical energy storage system according to the present invention 1, according to a second embodiment. The electrical energy storage system 1 comprises the two strings STR1, STR2 which are interconnected in parallel, wherein the strings STR1, STR2 have respectively been extended by one electrical energy storage unit 15, and thus comprise three electrical energy storage units 15 which are interconnected in series. The first electrically conductive cross-connection 11 is present between energy storage units 15 which are at an identical first electrical potential. The first electrically conductive cross-connection 11 is electrically conductively connected, via the diode 12, to a second electrically conductive cross-connection 21 which connects electrical energy storage units 15 which are at a second electrical potential. The second electrically conductive cross-connection 21 is connected to the current sensor 13 and the electrical energy source 14. The diode 12 and the electrically conductive connection to the current sensor 13 are situated at different ends of the second electrically conductive cross-connection 21.

Figure 3:
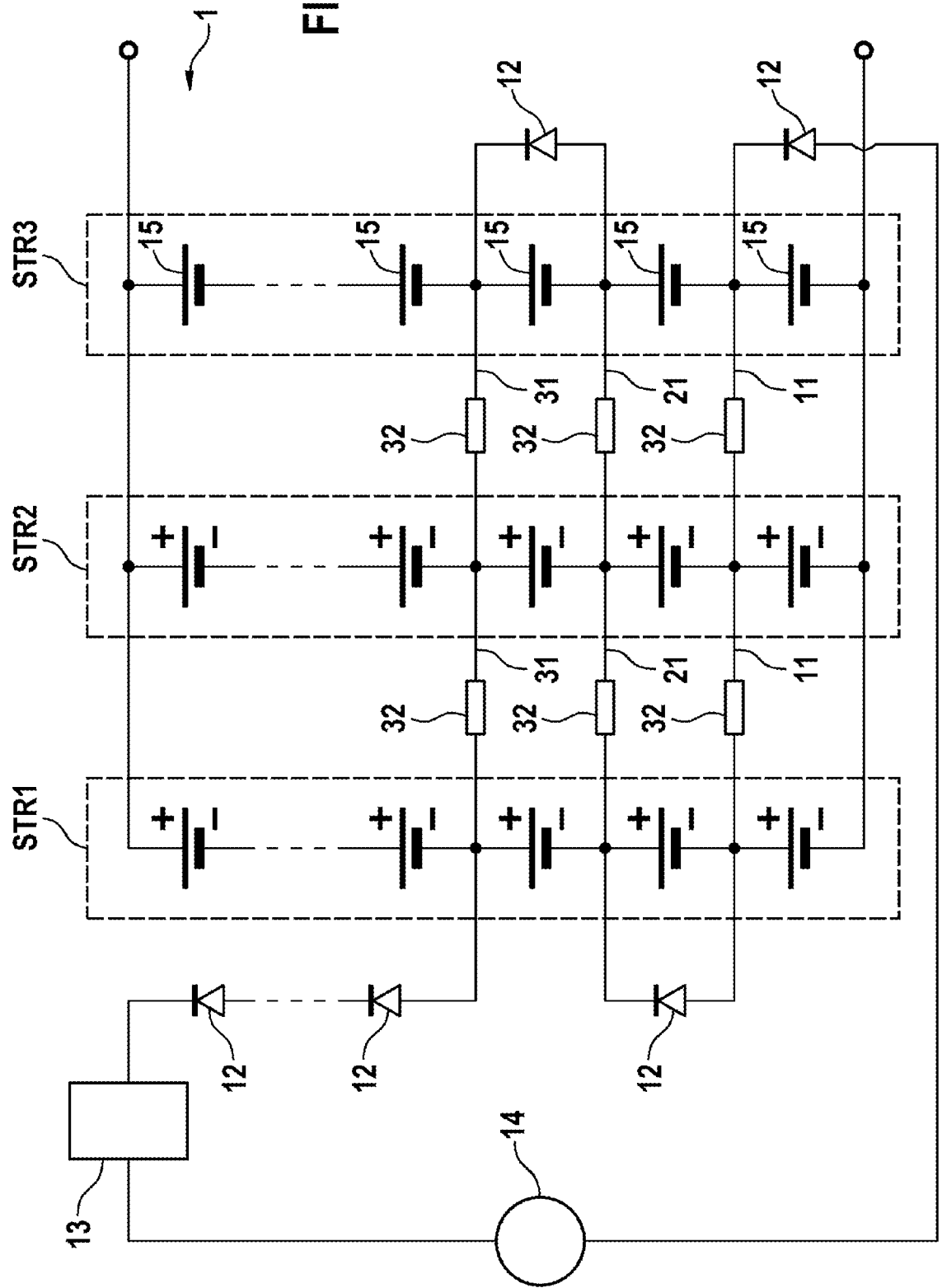
FIG. 3 shows a schematic representation of the electrical energy storage system according to the present invention, according to a third embodiment.

FIG. 3 shows a schematic representation of the electrical energy storage system 1 according to the present invention, according to a third embodiment. Here, the electrical energy storage system 1 comprises three strings STR1, STR2, STR3 connected in parallel. The dashed lines in the depiction of the strings STR1, STR2, STR3 indicate that the principle depicted in FIG. 1 and in FIG. 2 can in principle be extended to strings comprising a more or less arbitrary number of electrical energy storage units 15. Electrically conductive cross-connections 11, 21, 31 connect the electrical energy storage units 15, which are at an identical potential. Electrical resistance elements 32 are installed in the electrically conductive cross-connections 11, 21, 31, in order to limit compensation currents potentially flowing between the electrical energy storage units 15.

Figure 4:
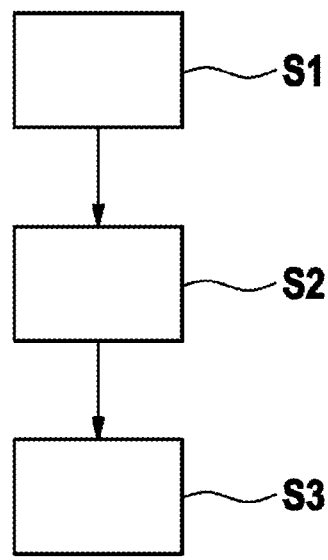
FIG. 4 shows a flow chart of the method according to the present invention, according to one embodiment.

FIG. 4 shows a flow diagram of the method according to the present invention, according to one embodiment. In a first step S1, a current signal profile within the circuit, which is formed by the components: electrically conductive cross-connection 11, diode 12, current sensor 13, electrical energy source 14, and a corresponding electrically conductive return connection to the electrically conductive cross-connection 11, is detected by means of the current sensor 13. In a second step S2, the detected current signal profile is compared to a current signal profile which is specified by the energy source 14. If there are no faults in the above-described circuit, these current signal profiles will be highly similar. In a third step S3, if a predefined signal deviation threshold value is exceeded, a signal indicating the detection of a line fault in the electrical energy storage system 1 or in the above-described circuit is subsequently generated, if necessary. Thus, for example, the user of the electrical energy storage system 1 may be informed of a fault in the electrical energy storage system 1.

Figure 5:
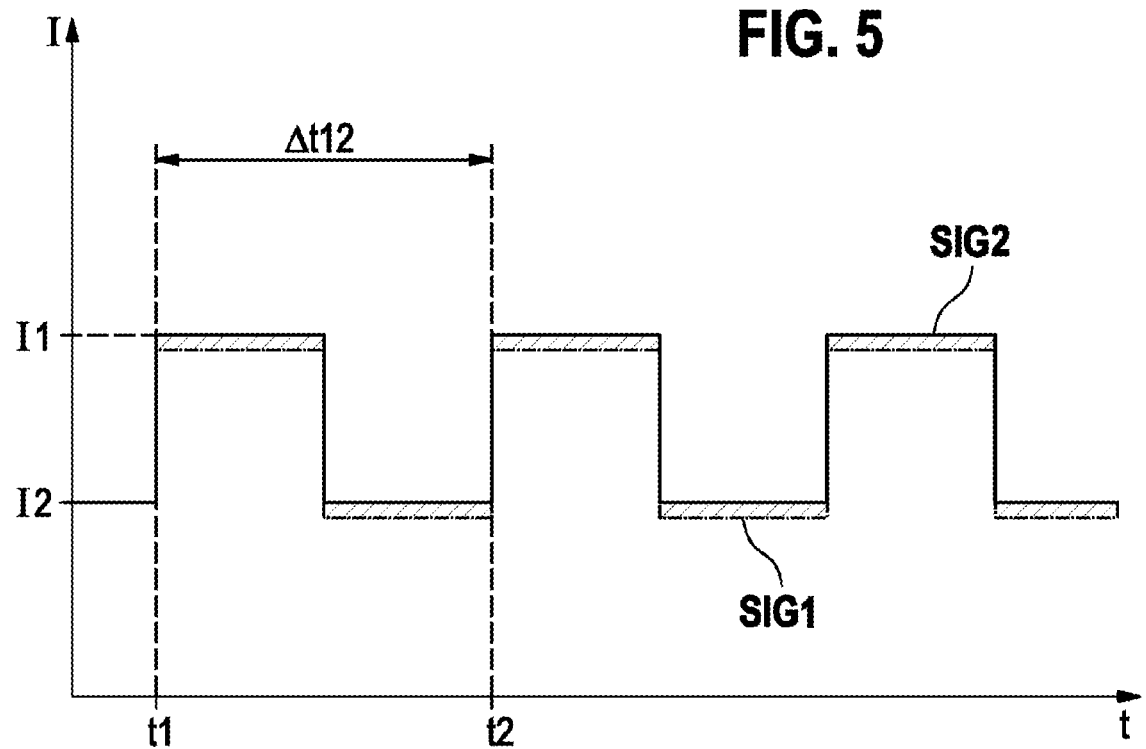
FIG. 5 shows a schematic representation of the current signal profiles used within the method according to the present invention, according to a first embodiment.

FIG. 5 shows a schematic representation of the current signal profiles SIG1, SIG2 according to a first embodiment, which are used within the method according to the present invention. The first current signal profile SIG1 shows the current signal profile detected by the current sensor 13. The second current signal profile SIG2 shows the current signal profile specified by the electrical energy source 14, which is known, for example, because it is specified by suitable programming on an electronic control unit. Both current signal profiles proceed in a pulse-shaped manner, between a first current value I1 and a second current value I2. A time difference $\Delta t12$, between a first instant t1 which determines a start of a current signal period, and a second instant t2 which determines an end of the current signal period, constitutes the period duration of the second current signal. By means of the integral of the magnitude of the difference between the first current signal profile SIG1 and the second current signal profile SIG2 over a period duration of the second current signal, a signal deviation value may be calculated which is compared to a predefined signal deviation threshold value, wherein if the predefined signal deviation threshold value is exceeded, a signal indicating the detection of a line fault is generated.

Figure 6:
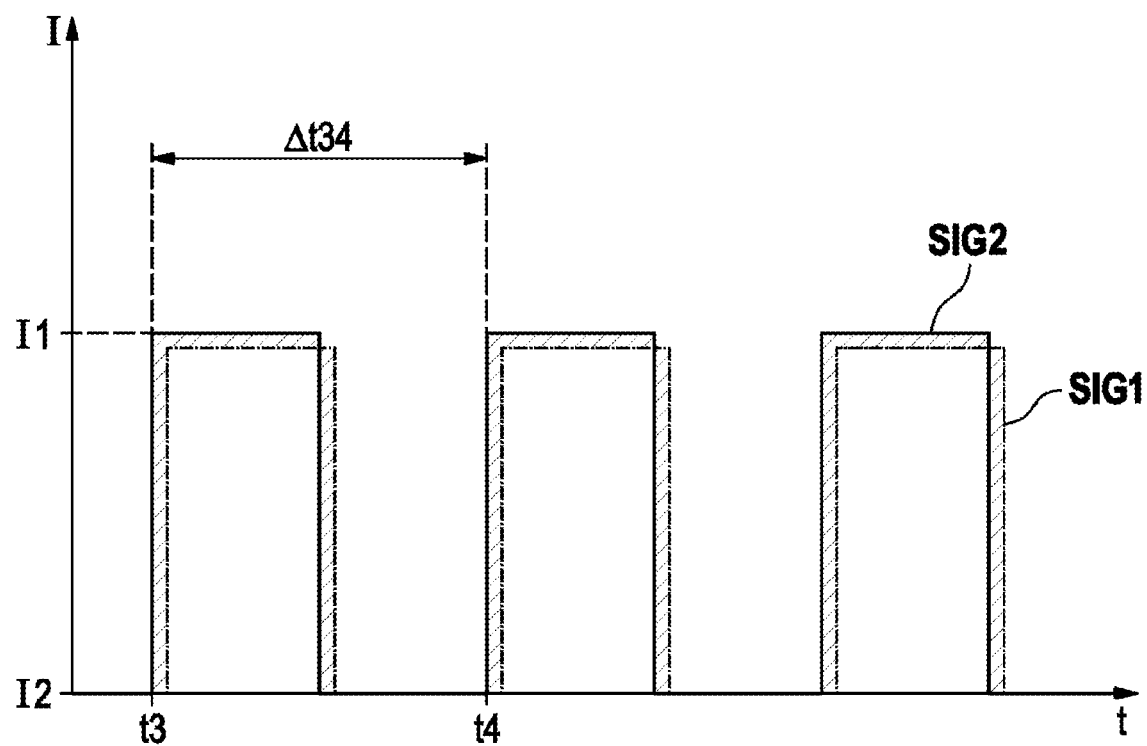
FIG. 6 shows a schematic representation of the current signal profiles used within the method according to the present invention, according to a second embodiment.

FIG. 6 shows a schematic representation of the current signal profiles SIG1, SIG2 according to second embodiment, which are used within the method according to the present invention. Here, the current signal profiles are also pulse-shaped, wherein the second current value I2 is 0 mA. A difference between the two current signal profiles SIG1, SIG2 is depicted by hatched lines in FIG. 6, exactly as in FIG. 5. A time difference $\Delta t34$ between a third instant t3 and a fourth instant t4 determines a period duration of the first current signal. Instead of the aforementioned integral as a signal deviation value, alternatively, a Fourier transform of the first current signal profile SIG1 and the second current signal profile SIG2 may be carried out, wherein the predefined signal deviation threshold value is then determined, for example, as a quantity in the phase space of the Fourier transform, for example, a power density.

The invention claimed is:

1. An electrical energy storage system (1), comprising:
at least two strings interconnected in parallel (STR1, STR2, STR3) and at an identical first electrical potential, the at least two strings (STR1, STR2, STR3) each comprising at least two electrical energy storage units (15) interconnected in series, wherein at least a first electrically conductive cross-connection (11), between electrical energy storage units (15) in the strings (STR1, STR2, STR3), is electrically conductively connected, via at least one diode (12), to a current sensor (13) configured to detect an electric current (13), a controllable electrical energy source (14), wherein the diode (12) is separate from the first electrically conductive cross-connection (11), and an electronic control unit configured to:
  a) detect at least a first current signal profile (SIG1) via the current sensor (13);
  b) compare the detected at least one first current signal profile (SIG1) to a second current signal profile (SIG2) specified by the controllable electrical energy source (14); and
  c) generate a signal indicating a detection of a line fault in the electrical energy storage system (1) when a predefined signal deviation threshold value is exceeded.

2. The electrical energy storage system (1) as claimed in claim 1, wherein the at least one first electrically conductive cross-connection (11) is electrically conductively connected, via the at least one diode (12), to at least a second electrically conductive cross-connection (21), between electrical energy storage units (15) in the strings (STR1, STR2, STR3) which are interconnected in parallel and are at an identical second electrical potential, wherein the first electrical potential and the second electrical potential are different.

3. The electrical energy storage system (1) according to claim 2, wherein the at least one second electrically conductive cross-connection (21), referenced to a defined reference potential, is at a higher electrical potential than the at least one first electrically conductive cross-connection (11), and the at least one diode (12) is installed in the forward direction between the at least one first electrically conductive cross-connection (11) and the at least one second electrically conductive cross-connection (21).

4. The electrical energy storage system (1) as claimed in claim 2, wherein the diode (12) and the electrically conductive connection to the current sensor (13) are situated at different ends of the second electrically conductive cross-connection (21).

5. The electrical energy storage system (1) as claimed in claim 1, wherein the controllable electrical energy source (14) is a current source.

6. The electrical energy storage system (1) as claimed in claim 1, wherein the electrical energy storage system is part of an electrically driven vehicle.

7. The electrical energy storage system (1) as claimed in claim 1, wherein the electrical energy storage system is part of a stationary energy storage system.

8. The electrical energy storage system (1) as claimed in claim 1, wherein the electrical energy storage system is part of an electrically operated hand tool.

9. A method for detecting a line fault in an electrical energy storage system (1) including at least two strings interconnected in parallel (STR1, STR2, STR3) and at an identical first electrical potential, the at least two strings (STR1, STR2, STR3) each comprising at least two electrical energy storage units (15) interconnected in series, wherein at least a first electrically conductive cross-connection (11), between electrical energy storage units (15) in the strings (STR1, STR2, STR3), is electrically conductively connected, via at least one diode (12), to a current sensor (13) configured to detect an electric current (13), and a controllable electrical energy source (14), wherein the diode (12) is separate from the first electrically conductive cross-connection (11), the method comprising:
  a) detecting at least a first current signal profile (SIG1) via the current sensor (13);
  b) comparing the detected at least one first current signal profile (SIG1) to a second current signal profile (SIG2) specified by the controllable electrical energy source (14); and c) generating a signal indicating a detection of a line fault in the electrical energy storage system (1) when a predefined signal deviation threshold value is exceeded.

10. The method as claimed in claim 9, wherein the controllable electrical energy source (14) generates a pulse-shaped current signal profile (SIG1, SIG2).

11. The method as claimed in claim 9, characterized in that the method is carried out for at least a predefined period ($\Delta t12$, $\Delta t34$).

12. The method as claimed in claim 9, wherein the method is carried out for an integral multiple of a period duration ($\Delta t12$, $\Delta t34$) of the second current signal.

13. A device, comprising an electrical energy storage system (1) comprising at least two strings interconnected in parallel (STR1, STR2, STR3) and at an identical first electrical potential, the at least two strings (STR1, STR2, STR3) each comprising at least two electrical energy storage units (15) interconnected in series, wherein at least a first electrically conductive cross-connection (11), between electrical energy storage units (15) in the strings (STR1, STR2, STR3), is electrically conductively connected, via at least one diode (12), to a current sensor (13) configured to detect an electric current (13) and a controllable electrical energy source (14), wherein the diode (12) is separate from the first electrically conductive cross-connection (11), the device configured to
 a) detect at least a first current signal profile (SIG1) via the current sensor (13);
 b) compare the detected at least one first current signal profile (SIG1) to a second current signal profile (SIG2) specified by the controllable electrical energy source (14); and
 c) generate a signal indicating a detection of a line fault in the electrical energy storage system (1) when a predefined signal deviation threshold value is exceeded.

* * * * *